(12) United States Patent
Seong et al.

(10) Patent No.: US 9,673,765 B2
(45) Date of Patent: Jun. 6, 2017

(54) CONCURRENT DUAL-BAND SIGNAL AMPLIFIER

(71) Applicant: SAMSUNG ELECTRO-MECHANICS CO., LTD., Suwon-si (KR)

(72) Inventors: Nack Gyun Seong, Suwon-si (KR); Seung Goo Jang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/972,372

(22) Filed: Dec. 17, 2015

(65) Prior Publication Data

US 2016/0190990 A1 Jun. 30, 2016

(30) Foreign Application Priority Data

Dec. 26, 2014 (KR) .................. 10-2014-0190836

(51) Int. Cl.
*H03F 1/07* (2006.01)
*H03F 3/193* (2006.01)
(Continued)

(52) U.S. Cl.
CPC ............. *H03F 3/193* (2013.01); *H03F 1/565* (2013.01); *H03F 3/3022* (2013.01); *H03F 3/505* (2013.01);
(Continued)

(58) Field of Classification Search
CPC ................................ H03F 1/07; H03F 1/0288
(Continued)

(56) References Cited

U.S. PATENT DOCUMENTS 2,248,462 A * 7/1941 Pollack ............... H03F 1/07
332/154
6,587,670 B1 7/2003 Hoyt et al.
(Continued)

FOREIGN PATENT DOCUMENTS

JP 2000-196376 A 7/2000
JP 2005-192260 A 7/2005
(Continued)

OTHER PUBLICATIONS

Korean Office Action issue on Oct. 29, 2015, in counterpart Korean Application No. 10-2014-0190836 (10 pages with English translation).

*Primary Examiner* — Henry Choe
(74) *Attorney, Agent, or Firm* — NSIP Law

(57) ABSTRACT

A signal amplifier includes a band suppression filter configured to suppress a preset band among bands included in an input signal, a first common source-type amplifier connected between a supply terminal of a driving voltage and a ground terminal and configured to amplify a first input signal separated from an output signal of the band suppression filter in a common input node to provide a first amplified signal to a common output node, a second common source-type amplifier configured to amplify a second input signal separated from the output signal of the band suppression filter in the common input node to provide a second amplified signal to the common output node, and an output matcher configured to match levels of impedance between the common output node and an output terminal and to transfer a combined signal to the output terminal.

15 Claims, 9 Drawing Sheets

(51) Int. Cl.
   *H03F 1/56*   (2006.01)
   *H03F 3/30*   (2006.01)
   *H03F 3/50*   (2006.01)

(52) U.S. Cl.
   CPC .. *H03F 2200/111* (2013.01); *H03F 2200/165* (2013.01); *H03F 2200/294* (2013.01); *H03F 2200/411* (2013.01); *H03F 2200/451* (2013.01); *H03F 2200/516* (2013.01); *H03F 2203/5036* (2013.01)

(58) Field of Classification Search
   USPC .............................. 330/295, 124 R, 262, 311
   See application file for complete search history.

(56) References Cited

U.S. PATENT DOCUMENTS

| | | | | |
|---|---|---|---|---|
| 6,674,337 | B2 * | 1/2004 | Hashemi | H03F 1/223 |
| | | | | 330/126 |
| 7,800,448 | B2 * | 9/2010 | Blednov | H03F 1/0288 |
| | | | | 330/124 R |
| 8,890,620 | B2 * | 11/2014 | Tamanoi | H03F 1/56 |
| | | | | 330/124 R |
| 9,160,285 | B2 * | 10/2015 | Seong | H03F 3/19 |
| 2009/0262034 | A1 | 10/2009 | Satoh | |
| 2012/0154305 | A1 | 6/2012 | Nunomaki | |
| 2013/0063215 | A1 | 3/2013 | Rabjohn | |

FOREIGN PATENT DOCUMENTS

| | | |
|---|---|---|
| JP | 2009-284459 A | 12/2009 |
| KR | 10-1998-034050 A | 8/1998 |
| KR | 10-2012-0070500 A | 6/2012 |

* cited by examiner

CONCURRENT DUAL-BAND SIGNAL AMPLIFIER

CROSS-REFERENCE TO RELATED APPLICATION(S)

This application claims the benefit under 35 USC 119(a) of Korean Patent Application No. 10-2014-0190836 filed on Dec. 26, 2014, with the Korean Intellectual Property Office, the entire disclosure of which is incorporated herein by reference for all purposes.

BACKGROUND

1. Field

The following description relates to a concurrent dual-band signal amplifier for use in a multi-band radio frequency (RF) receiving terminal. The concurrent dual-band amplifier has an inverted topology with a structure of stacked common sources.

2. Description of Related Art

Generally, in accordance with an increase in a demand for and diversification of standards for wireless communications, demand for a multi-band transmitter/receiver allowing a single portable device to simultaneously process signals within several bands has increased.

For example, in the case of wireless local area network (WLAN) usage, the 2.4 GHz and 5 GHz bands are being used simultaneously, and in the case of long term evolution (LTE) in Korea, the 800 MHz, 900 MHz, 1800 MHz, and 2.1 GHz bands are being used simultaneously.

Therefore, a device that is able to transmit and receive signals within multiple bands is desirable for use in a single radio frequency (RF) front end module. More specifically, a technology for processing signals at several frequencies or within a wide band of frequencies using a single low noise amplifier (LNA) positioned at an initial stage of a receiver is desirable.

Meanwhile, a low noise amplifier that supports a concurrent dual-band processor that is able to simultaneously process signals within two different bands and is able to support a wide band of frequencies may have a cascode structure or a cascade structure. For example, a cascode structure is a structure using a two-stage amplifier composed of a transconductance amplifier followed by a current buffer. By contrast, a cascade structure is an amplifier that has a two-port network constructed from a series of amplifiers, where each amplifier sends its output to the input of the next amplifier in a daisy chain.

Thus, an amplifier having such a cascode structure has a structure in which two transistors are stacked between a power terminal and a ground terminal (GND) and has a single current path, such that only a small amount of current is consumed. However, since an amplifier having a cascode structure includes a common gate amplifier whose gain characteristics may be poor and a common source amplifier whose gain characteristics may be excellent, in such a case corresponding to using the common gate amplifier, it is desirable to improve gain characteristics.

Also, in further detail, an amplifier that has a cascade structure has a structure in which amplifying units of at least four stages are located between an input terminal and an output terminal, and the amplifying units of respective stages are formed using a common source amplifier, such that gain characteristics of such amplifying units are excellent. However, because a large amount of current may be consumed when such a cascade structure is used due to the presence of two or more current paths, it is desirable for the amplifier having such a cascade structure to be improved in terms of current consumption.

As described further above, in the case of using the common source amplifier for which gain characteristics are excellent, an issue that a relatively large amount of current is consumed presents itself.

Alternative approaches disclose use of a dual-band low noise amplifier, but do not disclose a solution for the previously mentioned issue related to simultaneously achieving good gain characteristics while consuming a moderate amount of current.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide a concurrent dual-band signal amplifier in which an amount of consumed current is decreased, gain characteristics are improved, and the number of inductors used for input and output matching are reduced to decrease a size of the amplifier.

In one general aspect, a signal amplifier includes a band suppression filter configured to suppress a preset band among bands included in an input signal, a first common source-type amplifier connected between a supply terminal of a driving voltage and a ground terminal and configured to amplify a first input signal separated from an output signal of the band suppression filter in a common input node to provide a first amplified signal to a common output node, a second common source-type amplifier stacked between the supply terminal of the driving voltage and the ground terminal together with the first common source-type amplifier and configured to amplify a second input signal separated from the output signal of the band suppression filter in the common input node to provide a second amplified signal to the common output node, and an output matcher configured to match levels of impedance between the common output node and an output terminal and to transfer a combined signal generated by combining the first amplified signal and the second amplified signal with each other in the common output node to the output terminal, wherein the first and second common source-type amplifiers form a single current path between the supply terminal of the driving voltage and the ground terminal.

The band suppression filter may include a first resonator configured to suppress the preset band, and a second resonator configured to suppress the preset band.

The first resonator may include a first inductor and a first capacitor connected to each other in parallel, and may form a parallel resonance point in the preset band.

The second resonator may include a second inductor and a second capacitor connected to each other in series, and may further include a third capacitor connected to the second inductor in parallel, and may form a serial resonance point in the preset band.

The first common source-type amplifier may include a first P-type metal oxide semiconductor (PMOS) transistor having a source connected to the supply terminal of the driving voltage, a gate connected to an output terminal of the band suppression filter through a first coupling capacitor and connected to a supply terminal of a first gate voltage, and a drain connected to the common output node and configured to amplify a signal from the band suppression filter to provide the first amplified signal.

The second common source-type amplifier may include a first N-type MOS (NMOS) transistor having a drain connected to the common output node, a gate connected to an output terminal of the band suppression filter through a second coupling capacitor and connected to a supply terminal of a second gate voltage, and a source connected to the ground terminal and configured to amplify a signal from the band suppression filter to provide the second amplified signal.

The output matcher may include a source follower amplifier configured to transfer the combined signal to the output terminal.

The output matcher may include a second NMOS transistor having a drain connected to the supply terminal of the driving voltage, a gate connected to the common output node to receive the combined signal, and a source connected to the ground terminal through a source resistor and connected to the output terminal through an output capacitor.

In another general aspect, a signal amplifier includes a band suppression filter configured to suppress a preset band among bands included in an input signal, a first common source-type amplifier connected between a supply terminal of a driving voltage and a ground terminal and configured to amplify a first input signal separated from an output signal of the band suppression filter in a common input node to provide a first amplified signal to a common output node, a second common source-type amplifier stacked between the supply terminal of the driving voltage and the ground terminal together with the first common source-type amplifier and configured to amplify a second input signal separated from the output signal of the band suppression filter in the common input node to provide a second amplified signal to the common output node, an output matcher configured to match levels of impedance between the common output node and an output terminal and configured to transfer a combined signal generated by combining the first amplified signal and the second amplified signal with each other in the common output node to the output terminal, and a feedback circuit connected between the common input node and the common output node, configured to feedback a signal of the common output node to the common input node, wherein the first and second common source-type amplifiers form a single current path between the supply terminal of the driving voltage and the ground terminal.

The band suppression filter may include a first resonator configured to suppress the preset band, and a second resonator configured to suppress the preset band.

The first resonator may include a first inductor and a first capacitor connected to each other in parallel, and may form a parallel resonance point in the preset band.

The second resonator may include a second inductor and a second capacitor connected to each other in series, and may further include a third capacitor connected to the second inductor in parallel, and may form a serial resonance point in the preset band.

The first common source-type amplifier may include a first PMOS transistor having a source connected to the supply terminal of the driving voltage, a gate connected to an output terminal of the band suppression filter through a first coupling capacitor and connected to a supply terminal of a first gate voltage, and a drain connected to the common output node and configured to amplify a signal from the band suppression filter to provide the first amplified signal.

The second common source-type amplifier may include a first NMOS transistor having a drain connected to the common output node, a gate connected to an output terminal of the band suppression filter through a second coupling capacitor and connected to a supply terminal of a second gate voltage, and a source connected to the ground terminal and configured to amplify a signal from the band suppression filter to provide the second amplified signal.

The output matcher may include a source follower amplifier configured to transfer the combined signal to the output terminal.

The output matcher may include a second NMOS transistor having a drain connected to the supply terminal of the driving voltage, a gate connected to the common output node to receive the combined signal, and a source connected to the ground terminal through a source resistor and connected to the output terminal through an output capacitor.

Hence, in various examples, the first and second common source-type amplifiers form the single current path between the supply terminal of the driving voltage and the ground terminal, such that current consumption is decreased.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, examples are described in further detail with reference to the accompanying drawings.

Figure 1:
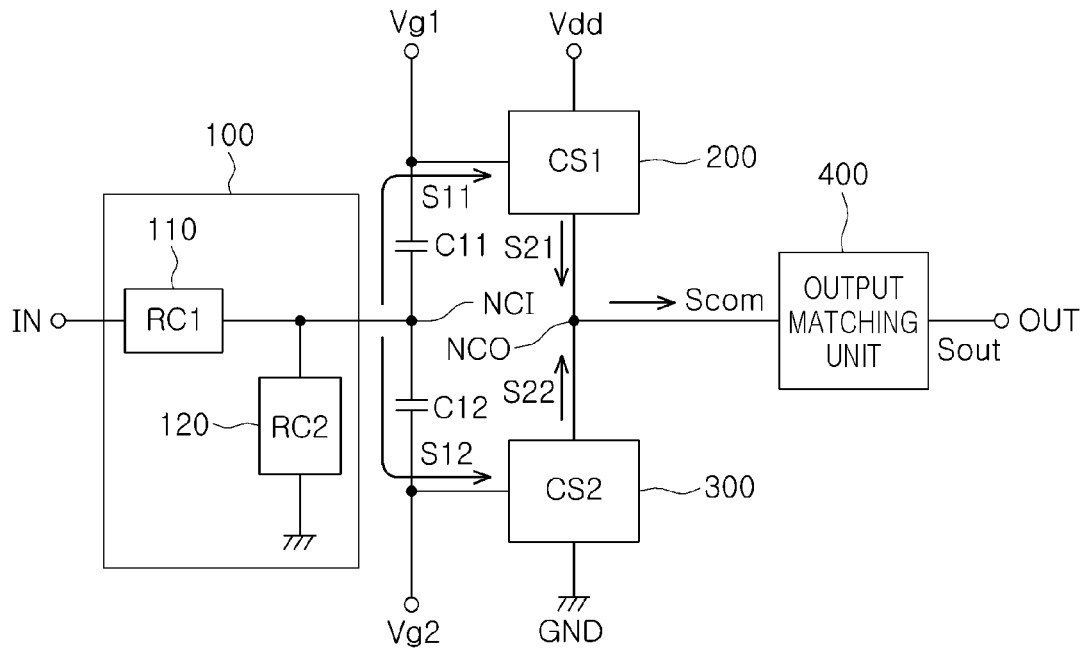
FIG. 1 is a circuit diagram illustrating a first implementation of a signal amplifier according to an example.
Figure 2:
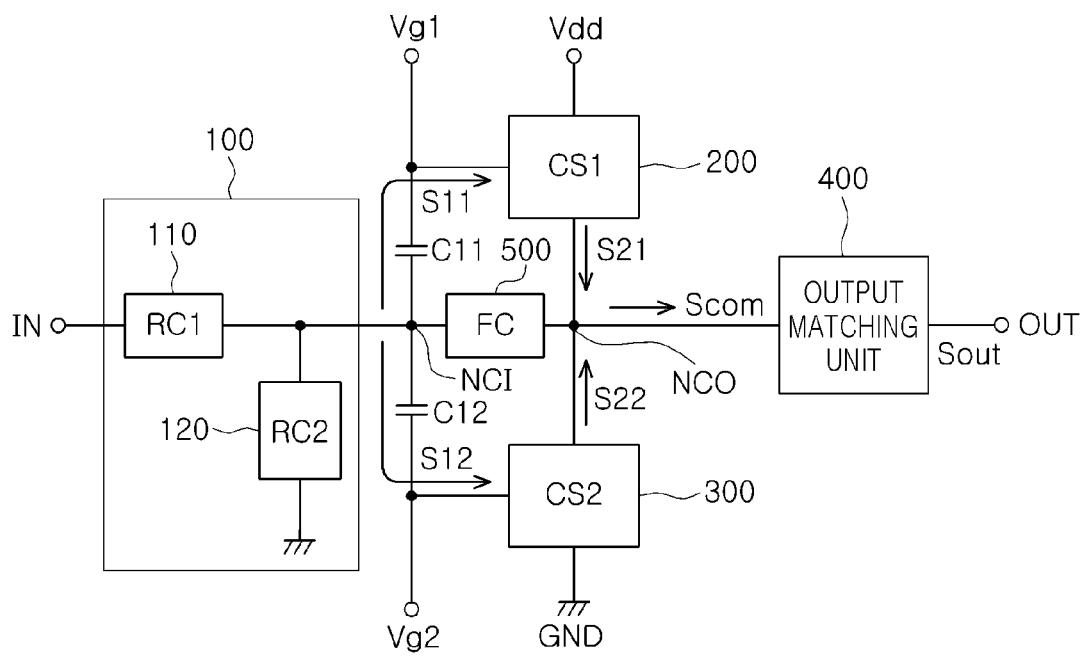
FIG. 2 is a circuit diagram illustrating a second implementation of a signal amplifier according to an example.

FIG. 1 is a circuit diagram illustrating a first implementation of a signal amplifier according to an example, and FIG. 2 is a circuit diagram illustrating a second implementation of a signal amplifier according to an example.

Referring to FIGS. 1 and 2, a signal amplifier according to an example includes a band suppression filter unit 100, a first common source-type amplifying unit 200, a second common source-type amplifying unit 300, and an output matching unit 400.

In these examples, the band suppression filter unit 100 suppresses a preset band among bands included in an input signal Sin. For example, in a scenario in which the signal amplifier is used in a preset concurrent dual-band system, the band suppression filter unit 100 suppresses a band that is other than a preset concurrent dual-band.

As an example, the band suppression filter unit 100 includes at least a first resonance unit 110 and a second resonance unit 120.

For example, the first common source-type amplifying unit 200 is connected between a supply terminal of a driving voltage Vdd and a ground terminal, and amplifies a first input signal separated from an output signal of the band suppression filter unit 100 in a common input node NCI to provide a first amplified signal S21 to a common output node NCO.

In such an example, the second common source-type amplifying unit 300 is stacked together with the first common source-type amplifying unit 200 between the driving voltage Vdd and the ground terminal, and amplifies a second input signal separated from the output signal of the band suppression filter unit 100 in the common input node NCI to provide a second amplified signal S22 to the common output node NCO.

In this example, the first common source-type amplifying unit 200 and the second common source-type amplifying unit 300 form a single current path between the supply terminal of the driving voltage Vdd and the ground terminal. Therefore, current consumption is decreased, but also two stacked source type amplifiers are used, such that a high degree of gain is achieved.

In addition, the output matching unit 400 matches levels of impedance between the common output node NCO and an output terminal OUT, and transfers a combined signal Scom, generated by combining the first amplified signal S21 and the second amplified signal S22 with each other in the common output node NCO, into the output terminal OUT.

Referring to FIG. 2, the signal amplifier further includes a feedback circuit unit 500.

In the example of FIG. 2, the feedback circuit unit 500 is connected between the common input node NCI and the common output node NCO so as to feedback a signal of the common output node NCO into the common input node NCI. In a scenario in which the feedback circuit unit 500 as described above is further included in the signal amplifier, a bandwidth of the signal amplifier is increased while a gain of the signal amplifier is also decreased.

Figure 3:
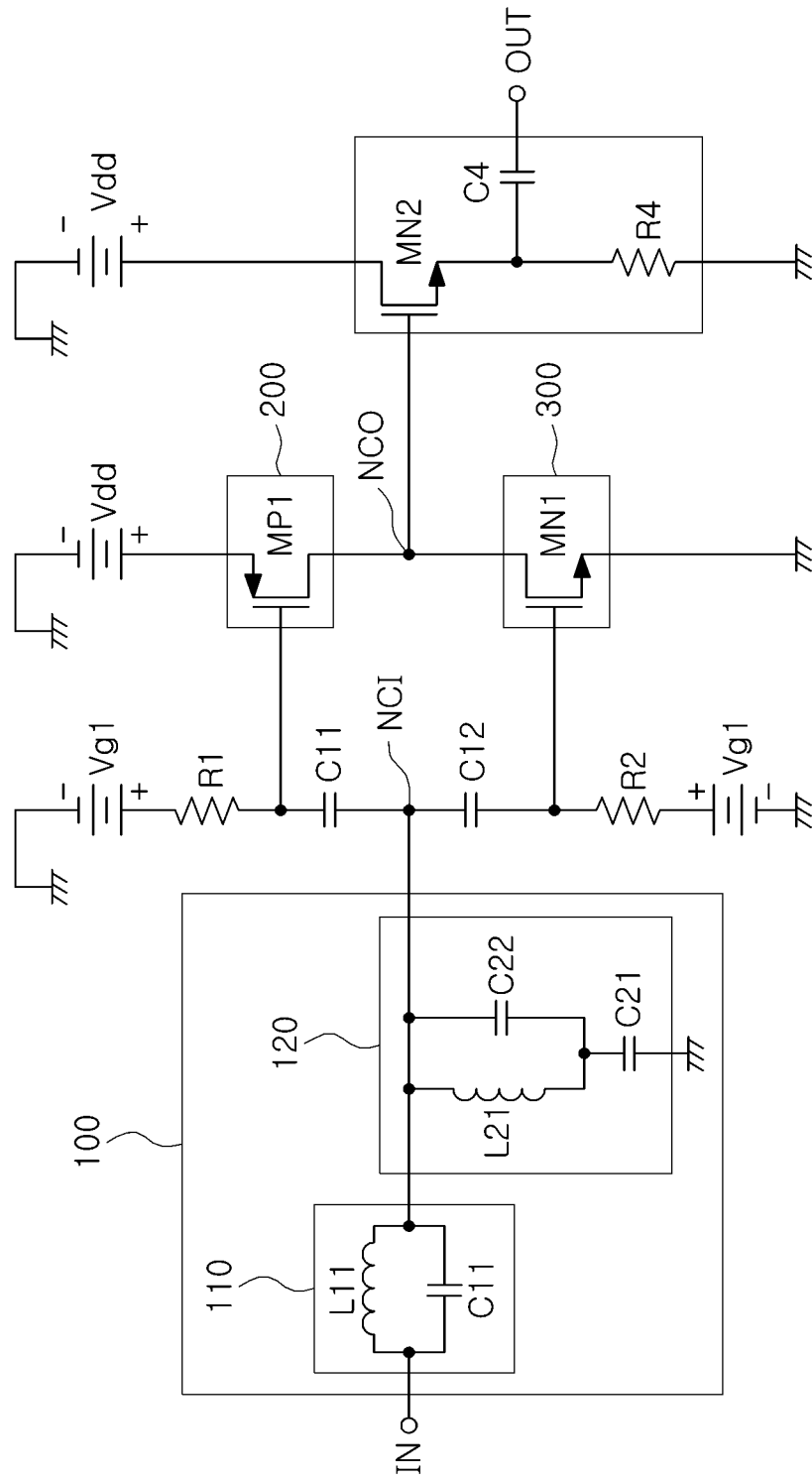
FIG. 3 is a detailed circuit diagram of the signal amplifier of the example of FIG. 1.
Figure 4:
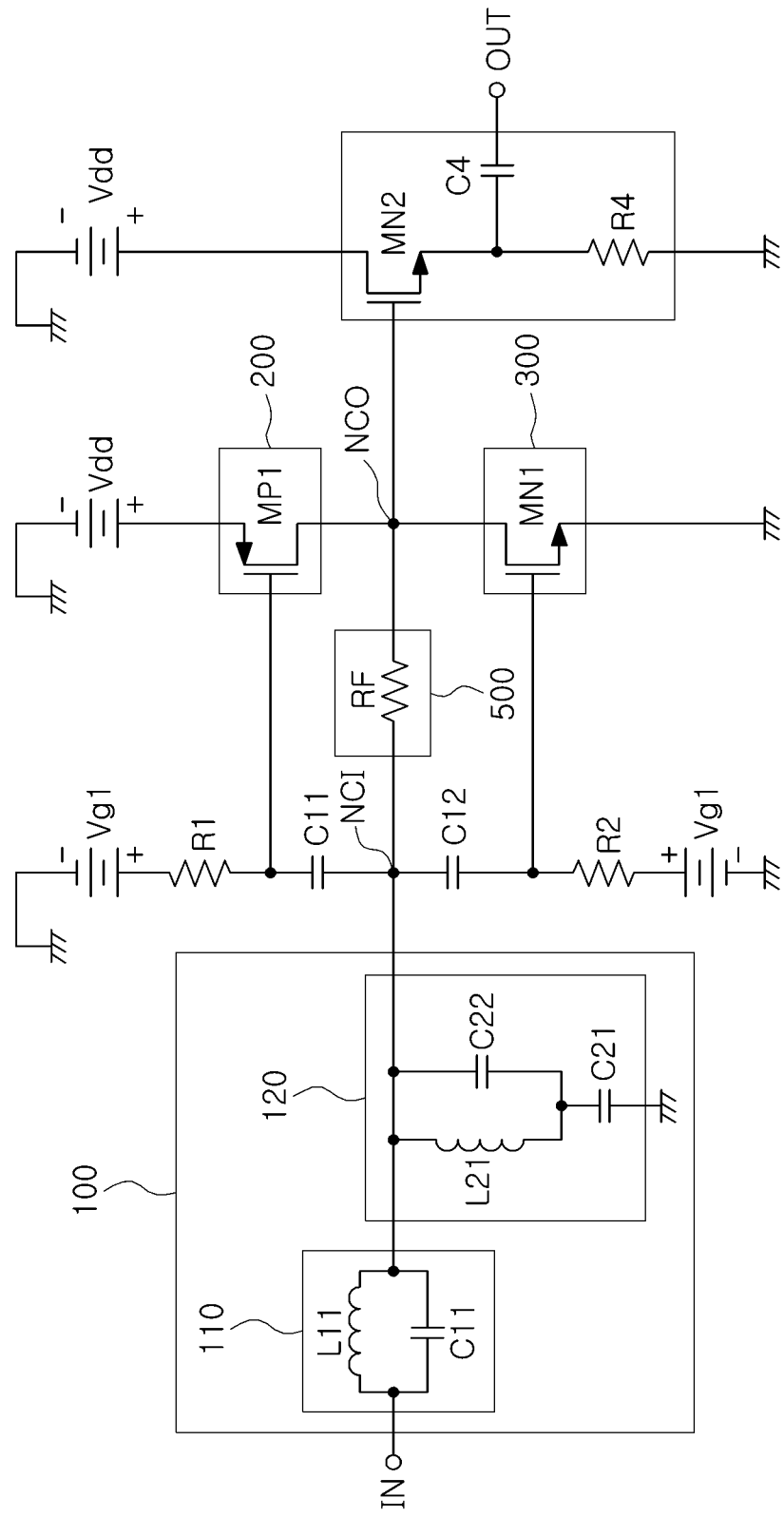
FIG. 4 is a detailed circuit diagram of the signal amplifier of the example of FIG. 2.

FIG. 3 is a detailed circuit diagram of the signal amplifier of the example of FIG. 1; and FIG. 4 is a detailed circuit diagram of the signal amplifier of the example of FIG. 2.

Referring to the examples of FIGS. 3 and 4, the first resonance unit 110 includes a first inductor L11 and a first capacitor C11 that are connected to each other in parallel. Here, the first resonance unit 110 including the first inductor L11 and the first capacitor C11 serve as a parallel resonance circuit to form a parallel resonance point in the preset band.

As an example, when the concurrent dual-bands are 800 MHz and 1.9 GHz, the parallel resonance point is formed in a band of approximately 1.4 GHz. In this example, the approximately 1.4 GHz band in which the parallel resonance point is formed is suppressed, and simultaneously bands of 800 MHz and 1.9 GHz, which are the concurrent dual-bands, are pass bands.

Also in this example, the second resonance unit 120 includes a second inductor L21 and a second capacitor C21 connected to each other in series, and further includes a third capacitor C22 connected to the second inductor L21 in parallel.

In this example, the second resonance unit 120 including an LC circuit of the second inductor L21 and the third capacitor C22 and the second capacitor C21 serve as a resonance circuit, constituting a serial circuit between the LC circuit L21 and C22 and the second capacitor C21, to form a resonance point in the preset band.

For example, when the concurrent dual-bands are 800 MHz and 1.9 GHz, the serial resonance point is formed in a band of approximately 1.4 GHz. In this example, the band of approximately 1.4 GHz in which the serial resonance point is formed is bypassed to a ground, and 800 MHz and 1.9 GHz bands, which are the concurrent dual-bands, are pass bands.

Furthermore, in order to form a resonance point in the 1.4 GHz band using a serial resonance circuit of the second inductor L21 and the second capacitor C21, the second inductor L21 is formed at an inductance pattern length to have a value of approximately 12 nH in inductance.

However, as described above, in an example in which the third capacitor C22 is added to the second inductor L21 in parallel, in order to form the resonance point in the 1.4 GHz band, in such an example, it is sufficient for the second inductor L21 to be formed with an inductance pattern length that has a value of approximately 3 nF, by using the additionally connected third capacitor C22.

As a result, since the second inductor L21 is formed to have a short inductance pattern length, corresponding to approximately ⅓ of an inductance pattern length in a case in which the third capacitor C22 is not added, a size of the signal amplifier is decreased due to the described use of the third capacitor C22.

Meanwhile, a resonance frequency is formed based on Equation 1, which is applied to a serial configuration of the second inductor L21 and the second capacitor C21 and a parallel configuration of the second inductor L21 and the third capacitor C22, as described further above.

For example, the second inductor L21 and the third capacitor C22 are formed in parallel with each other, and as a result a value of C, in Equation 1 below, is increased. Thus, by configuring elements in this manner, even when a value of L is reduced, a resonance frequency f does not change. Therefore, an area of a spiral inductor used in a layout is thereby decreased to decrease an entire size thereof.

$$f = \frac{1}{2\pi\sqrt{LC}}$$ Equation 1

For example, the first common source-type amplifying unit 200 includes a first P-type metal oxide semiconductor (PMOS) transistor MP1 having a source connected to the supply terminal of the driving voltage Vdd, a gate connected to an output terminal of the band suppression filter unit 100 through a first coupling capacitor C11 and connected to a supply terminal of a first gate voltage Vg1, and a drain connected to the common output node NCO. The first common source-type amplifying unit 200 also amplifies a first input signal S11 from the band suppression filter unit 110 in order to provide the first amplified signal S21.

In this example, the first PMOS transistor MP1 is driven by receiving the driving voltage Vdd at its source and by receiving the first gate voltage Vg1 at its gate, and amplifies the first input signal S11 input from the band suppression filter unit 100 through the first coupling capacitor C11 in order to provide the first amplified signal S21.

In addition, in this example, the second common source-type amplifying unit 300 includes a first N-type MOS (NMOS) transistor MN1 that has a drain connected to the common output node NCO, a gate connected to the output terminal of the band suppression filter unit 100 through a second coupling capacitor C12 and connected to a supply terminal of a second gate voltage Vg2, and a source connected to the ground terminal GND. The second common source-type amplifying unit 300 also amplifies a second input signal S12 from the band suppression filter unit 110 so as to provide the second amplified signal S22.

Thus, the first PMOS transistor MN1 is driven by receiving the driving voltage Vdd through the first PMOS transistor MP1 at the drain thereof and receiving the second gate voltage Vg2 at the gate thereof, and by amplifying the second input signal S12 input from the band suppression filter unit 100 through the second coupling capacitor C12 so as to provide the second amplified signal S22.

In addition, in an example, the output matching unit 400 is formed of a source follower amplifier that transfers the combined signal Scom to the output terminal OUT.

Hence, as an example, the output matching unit 400 includes a second NMOS transistor MN2 that has a drain connected to the supply terminal of the driving voltage Vdd, a gate connected to the common output node NCO in order to receive the combined signal Scom, and a source connected to the ground terminal through a source resistor R4 and connected to the output terminal OUT through an output capacitor C4.

Also, the second NMOS transistor MN2 included in the source follower amplifier receives the combined signal Scom generated by combining the first amplified signal S21 and the second amplified signal S22 with each other in the common output node NCO, at the base thereof. The second NMOS transistor MN2 also transfers the combined signal Scom to the output terminal OUT through its source.

Because the output matching unit 400 is implemented by the source follower amplifier as described above, the output matching unit 400 does not include an additional inductor or capacitor, but does include the second NMOS transistor MN2 and the source resistor R4.

Because the output matching unit 400 does not include the additional inductor, a size of the signal amplifier is accordingly decreased. At the same time, the output matching unit 400 matches levels of impedance between the common output node NCO and the output terminal OUT and serves as a buffer between the common output node NCO and the output terminal OUT.

Referring to the example of FIGS. 2 and 4, the feedback circuit unit 500 includes a feedback resistor RF that is connected between the common input node NCI and the common output node NCO.

The feedback resistor RF performs feedback on the combined signal of the common output node NCO to the common input node NCI. Thus, a bandwidth of the signal amplifier is increased while a gain of the signal amplifier is slightly decreased.

Figure 5:
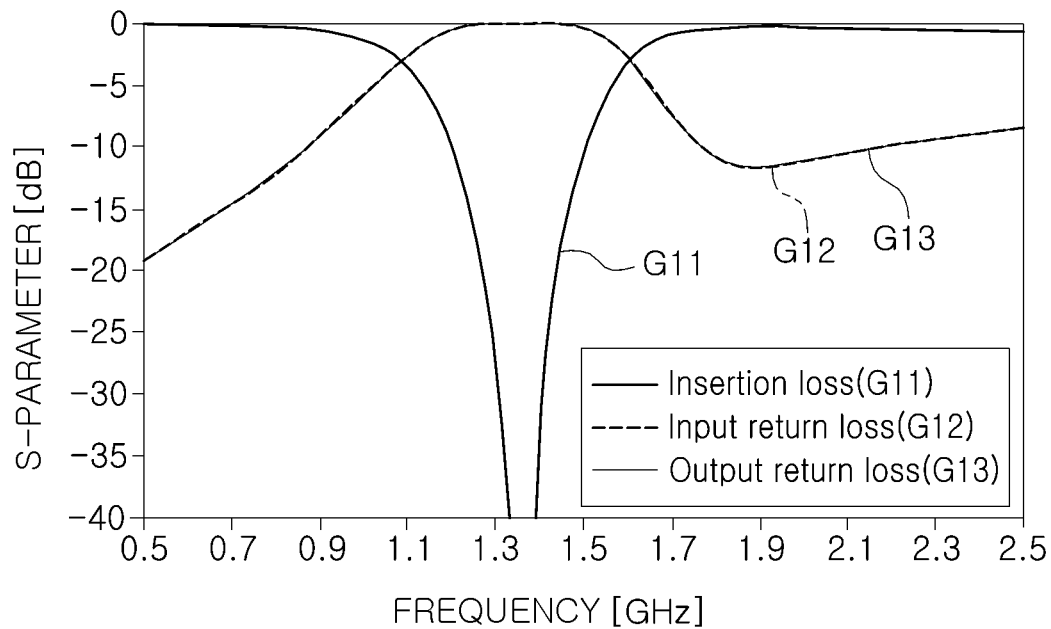
FIG. 5 is a graph illustrating S-parameter characteristics of a band suppression filter unit according to an example.

FIG. 5 is a graph illustrating S-parameter characteristics of a band suppression filter unit according to an example.

In the graph illustrating the S-parameter characteristics of the band suppression filter unit corresponding to FIG. 5, G11 is insertion loss, G12 is input return loss, and G13 is output return loss.

Referring to FIGS. 1 through 5, when the concurrent dual-bands are 800 MHz and 1.9 GHz, each of the parallel resonance point produced by the first resonance unit 110 and the serial resonance point produced by the second resonance unit 120 is formed to be approximately in the 1.4 GHz band. In this case, the band of approximately 1.4 GHz in which the parallel resonance point is formed is suppressed, the band of approximately 1.4 GHz in which the serial resonance point is formed is bypassed to the ground, and each of the bands of 800 MHz and 1.9 GHz, which are the concurrent dual-bands, is a pass band.

Referring to G11, G12, and G13 as illustrated in FIG. 5, it is observable that loss is not substantially present in each of the 800 MHz and 1.9 GHz bands, which are the pass bands and also the concurrent dual-bands, and loss is −40 dB or less in the 1.4 GHz band, which is a suppressed band.

Figure 6:
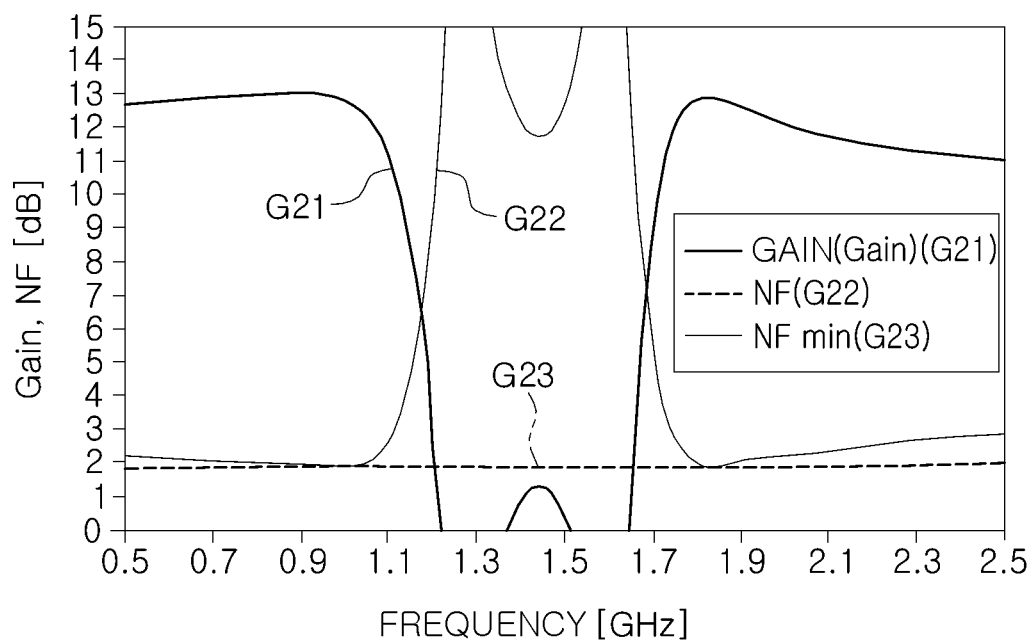
FIG. 6 is a graph illustrating gain and noise factor characteristics according to an example.
Figure 7:
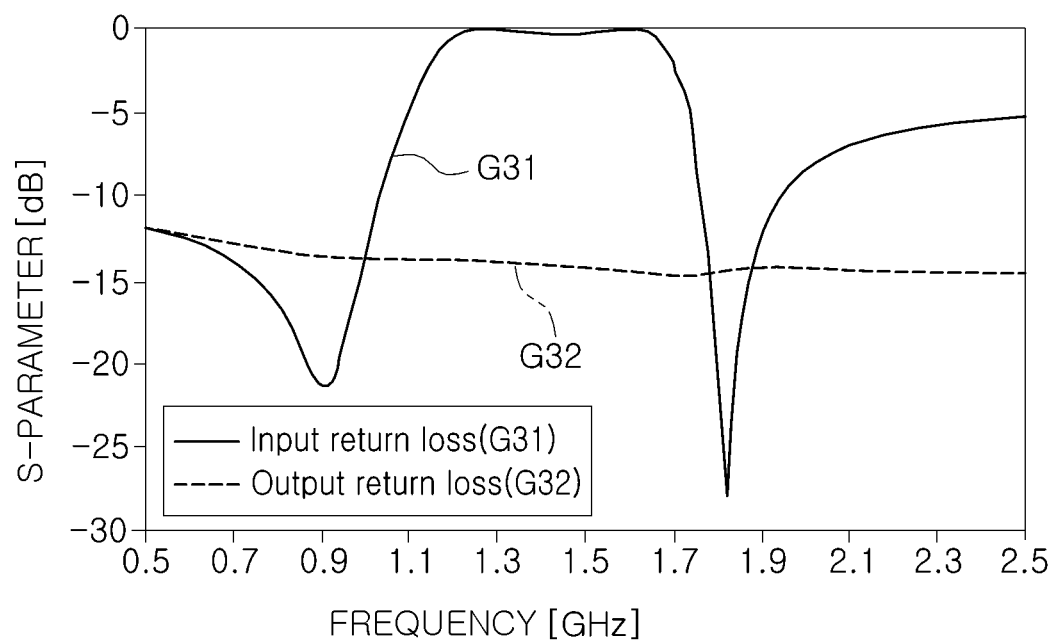
FIG. 7 is a graph illustrating input and output return loss characteristics according to an example.
Figure 8:
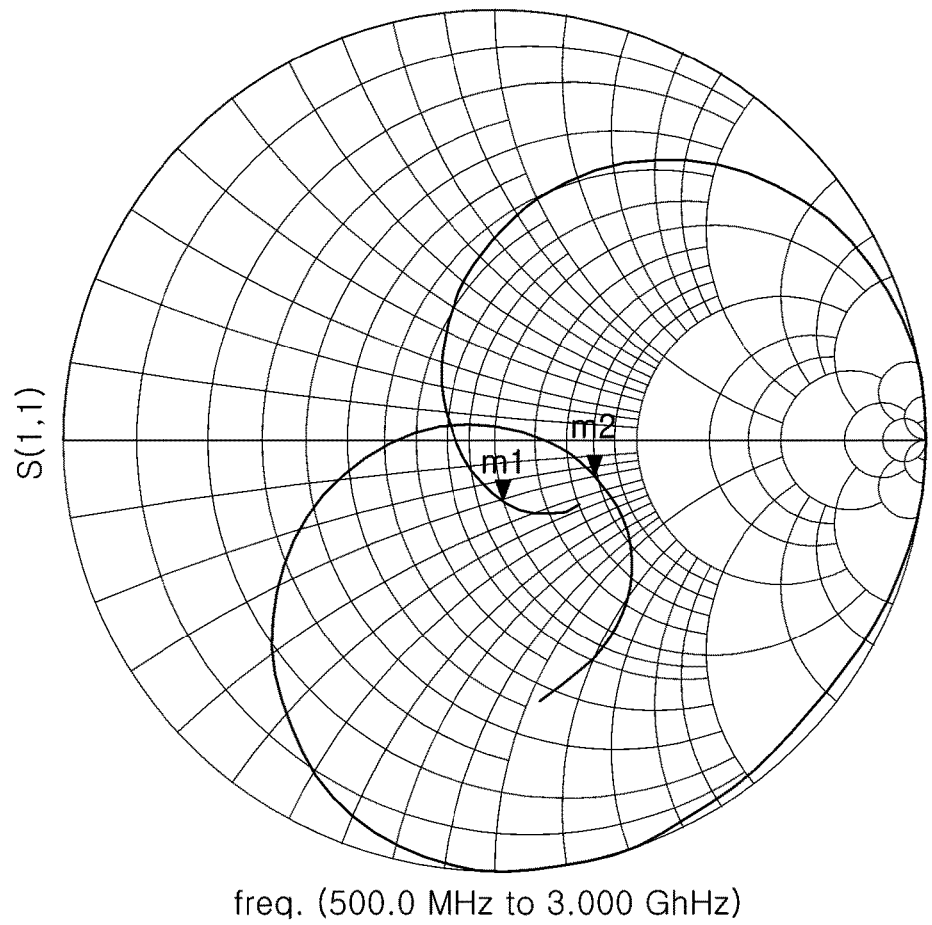
FIG. 8 is a chart illustrating input impedance matching according to an example.
Figure 9:
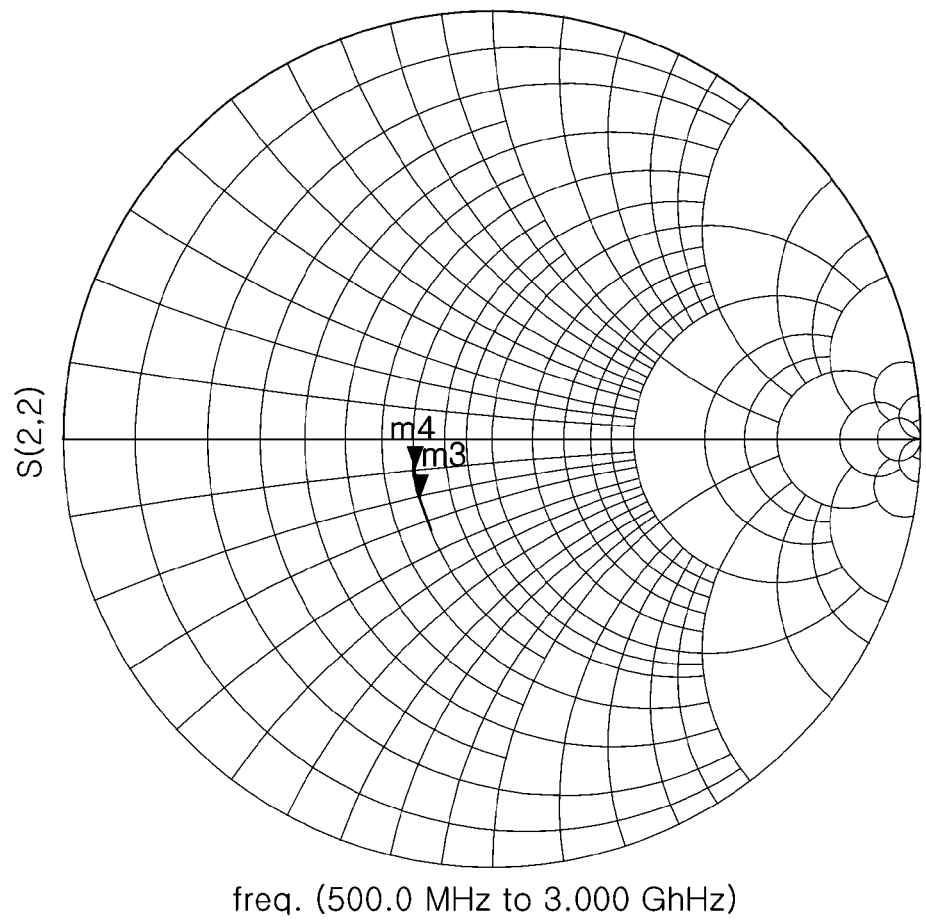
FIG. 9 is a chart illustrating output impedance matching according to an example.
Figure 10:
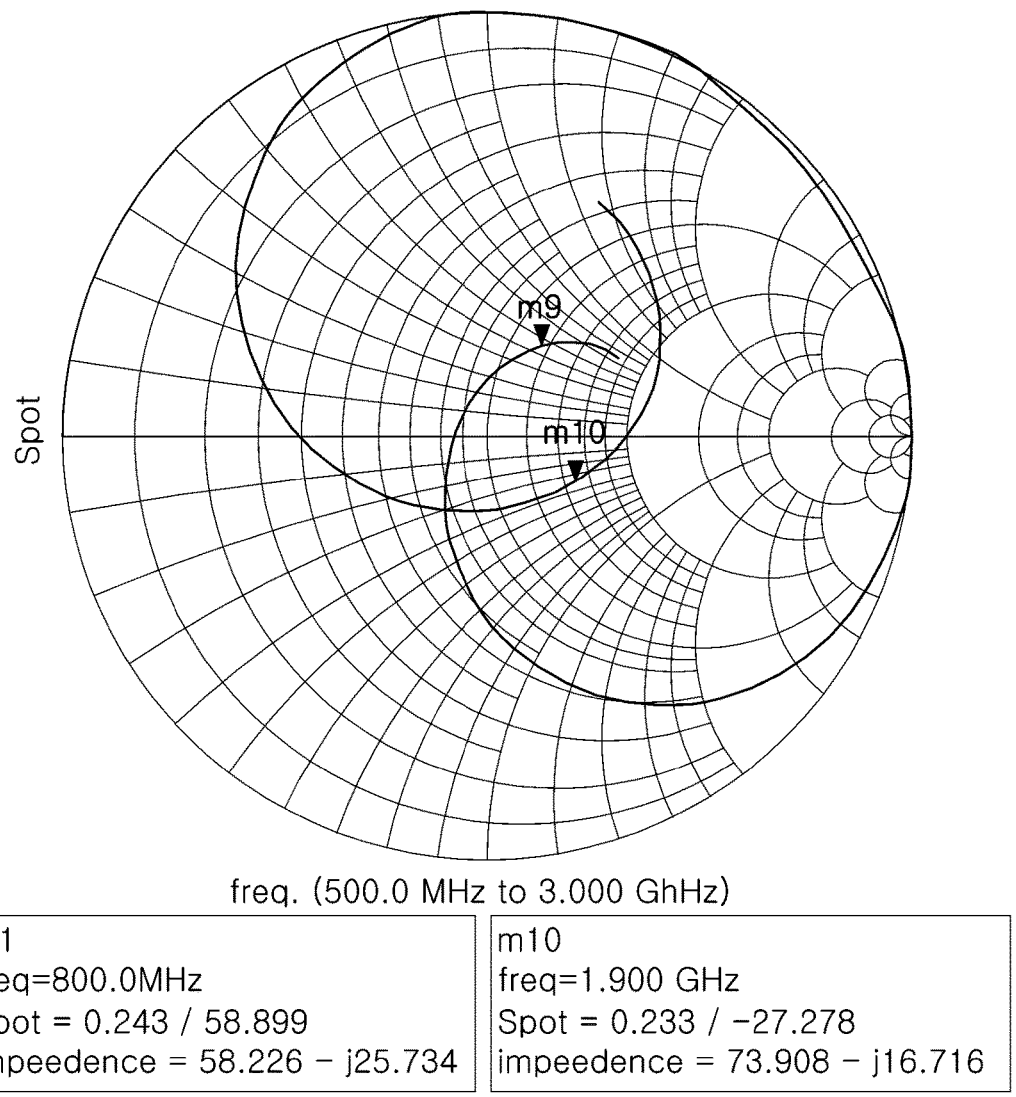
FIG. 10 is a graph illustrating noise impedance characteristics according to an example.
Figure 11:
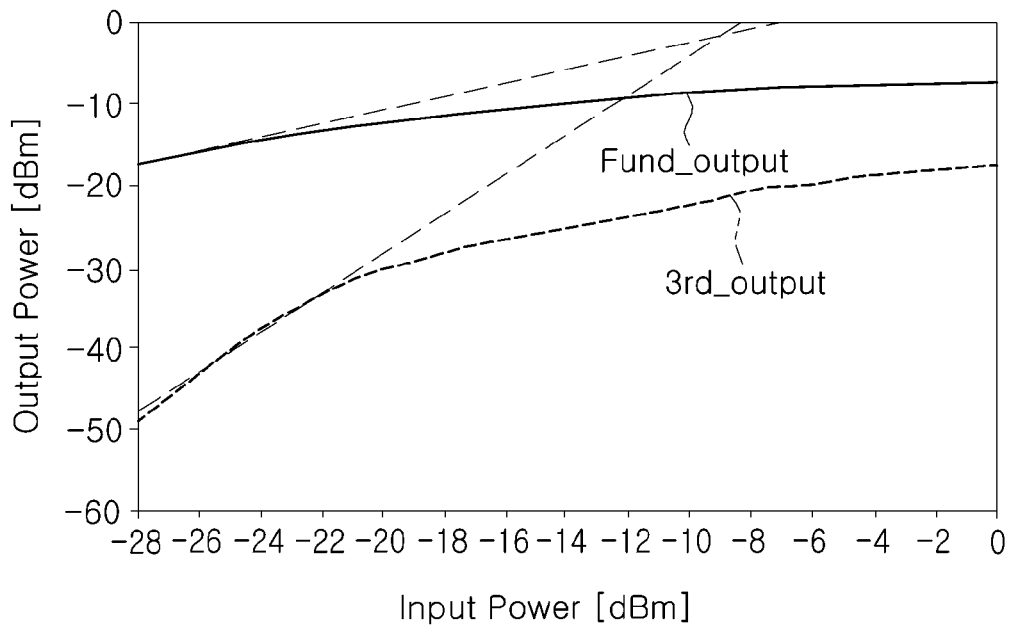
FIG. 11 is a graph illustrating 700 to 900 MHz-input third order intercept point (IIP3) characteristics according to an example.
Figure 12:
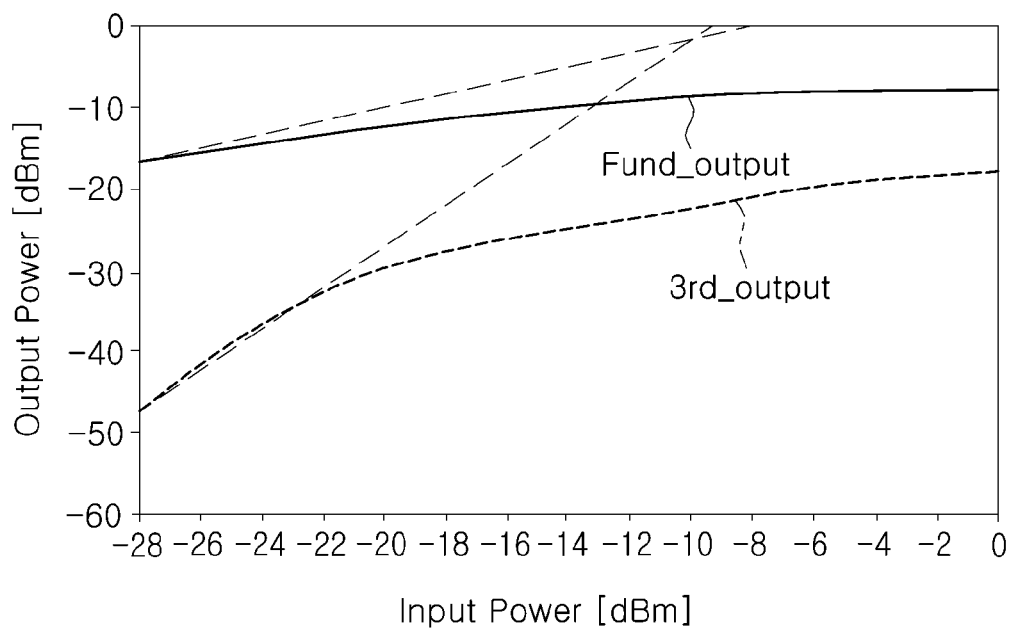
FIG. 12 is a graph illustrating 1900 to 2000 MHz-IIP3 characteristics according to an example.

FIG. 6 is a graph illustrating gain and noise factor characteristics according to an example. FIG. 7 is a graphs illustrating input and output return loss characteristics according to an example. FIG. 8 is a chart illustrating input impedance matching according to an example. FIG. 9 is a chart illustrating output impedance matching according to an example. FIG. 10 is a graph illustrating noise impedance characteristics according to an example. FIG. 11 is a graph illustrating 700 to 900 MHz-input third order intercept point (IIP3) characteristics according to an example. In addition, FIG. 12 is a graph illustrating 1900 to 2000 MHz-IIP3 characteristics according to an example.

A simulation for deriving information presented in the graphs of FIGS. 6 through 12 corresponds to conditions with a driving voltage Vdd of 1.8V, and a current consumption of about 7 mA.

In FIG. 6, G21 is a graph illustrating gain characteristics and G22 is a graph illustrating noise factor (NF) characteristics, and in FIG. 7, G31 is a graph illustrating input return loss and G32 is a graph illustrating output return loss.

Referring to FIGS. 6 and 7, it is observable that a gain of approximately 13 dB and NF of 2.0 dB in a 700 to 900 MHz band and a gain of approximately 12.5 dB and NF of 2.0 dB in an 1800 to 2000M band simultaneously appear as frequency characteristics and input and output return coefficients are limited to −10 dB or less in both of these two bands.

FIG. 8 illustrates how well input impedance matching m1 and m2 in each of the 800 MHz and 1900 MHz bands is achieved. Referring to the example of FIG. 8, in general, impedance matching is confirmed depending on how close impedance at a corresponding frequency approaches 50Ω.

FIG. 9 illustrates how well output impedance matching m3 and m4 in each of the bands of 800 MHz and 1.9 GHz is achieved. Referring to m3 and m4 of FIG. 9, it is observable that since impedance in each of the 800 MHz and 1.9 GHz bands is close to approximately 50Ω, impedance stays within an advantageous impedance range, such that the output impedance matching in each of the 800 MHz and 1900 MHz bands is successful.

In addition, FIG. 10 illustrates how well noise matching for m1 and m2 in each of the 800 MHz and 1900 MHz bands is made. Referring to m9 and m10 as shown in FIG. 10, it is to be appreciated that since impedance is close to approximately 50Ω in each of the bands of 800 MHz and 1.9 GHz, the impedance is included in an advantageous impedance range, such that the noise matching in each of the 800 MHz and 1900 MHz bands is performed well.

Referring to m9 and m10 as shown in FIG. 10, it is observable that because impedance in each of the bands of 800 MHz and 1.9 Hz is close to approximately 50Ω, the impedance is included in an advantageous impedance range, such that the input impedance matching in each of the 800 MHz and 1900 MHz bands is made successfully.

In addition, with reference to fundamental wave outputs Foud_output and third order harmonics 3rd_output as shown in FIGS. 11 and 12, these graphs confirm that IIP3 characteristics are about −10 dBm in the 800 MHz band and are about −7.5 dBm in the 1900 MHz band. The graphs also confirm that stability characteristics are also satisfied in both of the two bands.

As set forth above, according to examples, the signal amplifier is applied to a low power low noise amplifier (LNA) and is designed to have an inverted topology using a common source-type amplifier having a pair of a PMOS transistor and an NMOS transistor, such that an amount of consumed current is decreased, a gain is improved, and the number of inductors used for input and output matching is decreased to decrease an area of an electronic component as a result of using such an approach.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

The apparatuses, units, modules, devices, and other components illustrated in FIGS. 1-12 that perform the operations described herein with respect to FIGS. 1-12 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-12. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-12 that perform the operations described herein with respect to FIGS. 1-12 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A signal amplifier comprising:
a band suppression filter configured to suppress a preset band among bands included in an input signal;
a first common source-type amplifier connected between a supply terminal of a driving voltage and a ground terminal and configured to amplify a first input signal separated from an output signal of the band suppression filter in a common input node to provide a first amplified signal to a common output node;
a second common source-type amplifier stacked between the supply terminal of the driving voltage and the ground terminal together with the first common source-type amplifier and configured to amplify a second input signal separated from the output signal of the band suppression filter in the common input node to provide a second amplified signal to the common output node; and
an output matcher configured to match levels of impedance between the common output node and an output terminal and to transfer a combined signal generated by combining the first amplified signal and the second amplified signal with each other in the common output node to the output terminal,
wherein the first and second common source-type amplifiers form a single current path between the supply terminal of the driving voltage and the ground terminal, and
wherein the output matcher comprises a source follower amplifier configured to transfer the combined signal to the output terminal.

2. The signal amplifier of claim 1, wherein the band suppression filter comprises:
a first resonator configured to suppress the preset band; and
a second resonator configured to suppress the preset band.

3. The signal amplifier of claim 1, wherein the first resonator comprises a first inductor and a first capacitor connected to each other in parallel, and forms a parallel resonance point in the preset band.

4. The signal amplifier of claim 1, wherein the second resonator comprises a second inductor and a second capacitor connected to each other in series, and further comprises a third capacitor connected to the second inductor in parallel, and forms a serial resonance point in the preset band.

5. The signal amplifier of claim 1, wherein the first common source-type amplifier comprises a first P-type metal oxide semiconductor (PMOS) transistor having a source connected to the supply terminal of the driving voltage, a gate connected to an output terminal of the band suppression filter through a first coupling capacitor and connected to a supply terminal of a first gate voltage, and a drain connected to the common output node and configured to amplify a signal from the band suppression filter to provide the first amplified signal.

6. The signal amplifier of claim 1, wherein the second common source-type amplifier comprises a first N-type MOS (NMOS) transistor having a drain connected to the common output node, a gate connected to an output terminal of the band suppression filter through a second coupling capacitor and connected to a supply terminal of a second gate voltage, and a source connected to the ground terminal and configured to amplify a signal from the band suppression filter to provide the second amplified signal.

7. The signal amplifier of claim 1, wherein the output matcher comprises a second NMOS transistor having a drain connected to the supply terminal of the driving voltage, a gate connected to the common output node to receive the combined signal, and a source connected to the ground terminal through a source resistor and connected to the output terminal through an output capacitor.

8. A signal amplifier comprising:
a band suppression filter configured to suppress a preset band among bands included in an input signal;
a first common source-type amplifier connected between a supply terminal of a driving voltage and a ground terminal and configured to amplify a first input signal separated from an output signal of the band suppression filter in a common input node to provide a first amplified signal to a common output node;
a second common source-type amplifier stacked between the supply terminal of the driving voltage and the ground terminal together with the first common source-type amplifier and configured to amplify a second input signal separated from the output signal of the band suppression filter in the common input node to provide a second amplified signal to the common output node;

an output matcher configured to match levels of impedance between the common output node and an output terminal and configured to transfer a combined signal generated by combining the first amplified signal and the second amplified signal with each other in the common output node to the output terminal; and a feedback circuit connected between the common input node and the common output node, configured to feedback a signal of the common output node to the common input node, wherein the first and second common source-type amplifiers form a single current path between the supply terminal of the driving voltage and the ground terminal.

9. The signal amplifier of claim 8, wherein the band suppression filter comprises:

a first resonator configured to suppress the preset band; and a second resonator configured to suppress the preset band.

10. The signal amplifier of claim 8, wherein the first resonator comprises a first inductor and a first capacitor connected to each other in parallel, and forms a parallel resonance point in the preset band.

11. The signal amplifier of claim 8, wherein the second resonator comprises a second inductor and a second capacitor connected to each other in series, and further comprises a third capacitor connected to the second inductor in parallel, and forms a serial resonance point in the preset band.

12. The signal amplifier of claim 8, wherein the first common source-type amplifier comprises a first PMOS transistor having a source connected to the supply terminal of the driving voltage, a gate connected to an output terminal of the band suppression filter through a first coupling capacitor and connected to a supply terminal of a first gate voltage, and a drain connected to the common output node and configured to amplify a signal from the band suppression filter to provide the first amplified signal.

13. The signal amplifier of claim 8, wherein the second common source-type amplifier comprises a first NMOS transistor having a drain connected to the common output node, a gate connected to an output terminal of the band suppression filter through a second coupling capacitor and connected to a supply terminal of a second gate voltage, and a source connected to the ground terminal and configured to amplify a signal from the band suppression filter to provide the second amplified signal.

14. The signal amplifier of claim 8, wherein the output matcher comprises a source follower amplifier configured to transfer the combined signal to the output terminal.

15. The signal amplifier of claim 8, wherein the output matcher comprises a second NMOS transistor having a drain connected to the supply terminal of the driving voltage, a gate connected to the common output node to receive the combined signal, and a source connected to the ground terminal through a source resistor and connected to the output terminal through an output capacitor.

* * * * *